United States Patent
Briggs et al.

(10) Patent No.: US 11,869,783 B2
(45) Date of Patent: *Jan. 9, 2024

(54) OPTIMIZATING SEMICONDUCTOR BINNING BY FEED-FORWARD PROCESS ADJUSTMENT

(71) Applicant: International Business Machines Corporation, Armonk, NY (US)

(72) Inventors: Benjamin D. Briggs, Waterford, NY (US); Lawrence A. Clevenger, Dutchess, NY (US); Nicholas A. Lanzillo, Troy, NY (US); Michael Rizzolo, Albany, NY (US); Theodorus E. Standaert, Clifton Park, NY (US); James Stathis, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 385 days.

This patent is subject to a terminal disclaimer.

(21) Appl. No.: 17/244,084

(22) Filed: Apr. 29, 2021

(65) Prior Publication Data
US 2021/0249288 A1   Aug. 12, 2021

Related U.S. Application Data

(63) Continuation of application No. 15/791,451, filed on Oct. 24, 2017, now Pat. No. 11,049,744.

(51) Int. Cl.
*H01L 21/67* (2006.01)
*G06N 5/04* (2023.01)
*G06N 20/00* (2019.01)

(52) U.S. Cl.
CPC ......... *H01L 21/67271* (2013.01); *G06N 5/04* (2013.01); *G06N 20/00* (2019.01)

(58) Field of Classification Search
CPC .... H01L 21/67271; G06N 5/04; G06N 20/00; G06N 5/046

See application file for complete search history.

(56) References Cited

U.S. PATENT DOCUMENTS

| 6,133,582 A | 10/2000 | Fetzer et al. |
| 7,325,180 B2 | 1/2008 | Pileggi et al. |

(Continued)

FOREIGN PATENT DOCUMENTS

| CN | 107077463 A | 8/2017 |
| WO | 2016128189 A1 | 8/2016 |

OTHER PUBLICATIONS

Chinese Office Action dated Feb. 3, 2023 from Chinese Application No. 201880066111.9 filed Oct. 22, 2018.

(Continued)

*Primary Examiner* — Nha T Nguyen
(74) *Attorney, Agent, or Firm* — Joseph P. Curcuru

(57) ABSTRACT

One or more processors determine a predicted sorting bin of a semiconductor device, based on measurement and test data performed on the semiconductor device subsequent to a current metallization layer. A current predicted sorting bin and a target sorting bin are determined by a machine learning model for the semiconductor device; the target bin include higher performance semiconductor devices than the predicted sorting bin. The model determines a performance level improvement attainable by adjustments made to process parameters of subsequent metallization layers of the semiconductor device. Adjustments to process parameters are generated, based on measurement and test data of the current metallization layer of semiconductor device, and the adjustment outputs for the process parameters of the subsequent metallization layers of the semiconductor device are (Continued)

made available to the one or more subsequent metallization layer processes by a feed-forward mechanism.

25 Claims, 5 Drawing Sheets

(56) References Cited

U.S. PATENT DOCUMENTS

| | | | |
|---|---|---|---|
| 7,937,179 B2 | 5/2011 | Shimshi et al. | |
| 7,962,874 B2 | 6/2011 | Foreman et al. | |
| 8,041,451 B2 | 10/2011 | Wu et al. | |
| 8,082,055 B2 | 12/2011 | Lin et al. | |
| 8,086,988 B2 | 12/2011 | Buck et al. | |
| 8,452,439 B2 | 5/2013 | Wu et al. | |
| 8,712,718 B1* | 4/2014 | Camarota | G01R 31/2894 702/117 |
| 9,076,156 B2 | 7/2015 | Newnham et al. | |
| 9,430,606 B2 | 8/2016 | Oberai | |
| 10,761,137 B1* | 9/2020 | Chung | G01R 31/2851 |
| 11,144,842 B2* | 10/2021 | Das | G05B 17/02 |
| 2007/0044710 A1 | 3/2007 | Buschbeck | |
| 2007/0098883 A1 | 5/2007 | Daisuke | |
| 2007/0178691 A1 | 8/2007 | Richter | |
| 2010/0293512 A1* | 11/2010 | Buck | G06F 30/30 716/113 |
| 2011/0106497 A1* | 5/2011 | Visweswariah | G06F 30/30 702/182 |
| 2011/0112999 A1 | 5/2011 | Lee | |
| 2014/0039664 A1 | 2/2014 | Anemikos et al. | |
| 2014/0107822 A1* | 4/2014 | Chadwick | H01L 22/20 700/95 |
| 2015/0066467 A1* | 3/2015 | Acar | G06F 30/367 703/14 |
| 2015/0081599 A1* | 3/2015 | Dobler | G01R 31/00 706/12 |
| 2015/0226790 A1* | 8/2015 | Chen | G01R 31/31718 702/117 |
| 2016/0098645 A1 | 4/2016 | Sharma | |
| 2016/0148850 A1 | 5/2016 | David | |
| 2016/0291082 A1* | 10/2016 | Kwak | G11C 29/006 |
| 2017/0109645 A1* | 4/2017 | Hohndel | G06F 11/3055 |
| 2017/0200264 A1 | 7/2017 | Park | |

OTHER PUBLICATIONS

Appendix P—List of IBM Patents or Patent Applications Treated as Related, Filed Herewith, 2 Pages.

IBM, "On-Chip Parameter Matching to Optimize Product Design Using On-Chip Parametric Measurement Macro", An IP.com Prior Art Database Technical Disclosure, Publication Date: Apr. 17, 2009, IP.com No. PCOM000181910D.

IBM, "PSRO Yield and Model to Hardware Correlation Improvement for ASIC Arrays", An IP.com Prior Art Database Technical Disclosure, Publication Date: Nov. 13, 2008, IP.com No. IPCOM000176339D.

International Search Report and Written Opinion dated Jan. 9, 2019 from corresponding PCT Application No. PCT/IB2018/058191.

U.S. Appl. No. 15/791,451, filed Oct. 24, 2017.

* cited by examiner

OPTIMIZATING SEMICONDUCTOR BINNING BY FEED-FORWARD PROCESS ADJUSTMENT

The present invention relates generally to the field of binning semiconductors, and more particularly to feed forwarding of process compensating adjustments based on machine learning of process parameter variation effects.

BACKGROUND OF THE INVENTION

Manufacturing of semiconductor integrated circuits (ICs), also referred to as "chips," often results in final products that vary in their tested specifications of speed performance and reliability. Microprocessor chips satisfying particular performance criteria are sorted in a process step often referred to as "binning," in which the chips are placed in groups, or "bins," designated as meeting particular speed and power performance levels.

Speed binning in modern semiconductor microprocessor manufacturing is commonly practiced due to inherent manufacturing process variations affecting individual chip performance and reliability. Multiple microprocessors are produced from a single silicon wafer which, based on the die size of the microprocessor and the silicon wafer, can include dozens to hundreds, or thousands of finished process chips. Speed binning decisions are performed as a result of measurements and testing of completely fabricated chips. By sorting completed chips, based on their particular performance against criteria for a particular bin, manufacturers are able to recover sales income by selling lower-bin designated chips that satisfy lower level performance criteria, at lower prices.

SUMMARY

Embodiments of the present invention disclose a method, computer program product, and system for generating a machine learning model for improving performance levels of fabricated semiconductor devices. The method provides for one or more processors to determine a first set of correlations between process parameters of a metallization layer for fabrication of semiconductor devices, and measurement and test data performed subsequent to the metallization layer for the fabrication of the semiconductor devices, for a plurality of metallization layers and a multitude of fabricated semiconductor devices. The one or more processors determine a second set of correlations between the measurement and test data performed subsequent to the metallization layer of the semiconductor devices and predicted performance level of the semiconductor devices. The one or more processors generate a machine learning model, based on the first set of correlations and the second set of correlations, and train the machine learning model to determine an initial sorting bin, a target sorting bin, and a current sorting bin of a first semiconductor device, and determine adjustments to process parameters of a subsequent metallization layer that improve the performance levels of the first semiconductor device by compensating for performance-reducing conditions detected in earlier process measurement and testing operations.

The one or more processors generate a machine-learning model to determine a potential improvement of physical and electrical performance levels of a first semiconductor device by performing adjustments to process parameters of a subsequent metallization layer for the first semiconductor device, and the one or more processors train the machine learning model to: predict an initial sorting bin for the first semiconductor device; determine a target sorting bin, wherein the target sorting bin designates semiconductor devices having higher performance levels than the initial sorting bin, determine a current sorting bin; and determine adjustments to process parameters of one or more subsequent metallization layers of the first semiconductor device that produces an improved performance level of the first semiconductor device, such that the training of the machine learning model is based on the first set of correlations and the second set of correlations, and applying supervised learning of metallization layer process parameter data, measurement and test data, and performance level data of a multitude of wafers containing semiconductor devices.

Embodiments of the present invention disclose a method, computer program product, and system for sorting a fabricated semiconductor device into a higher performance designated sorting bin by improving a performance level of the semiconductor device. The method provides for one or more processors to determine a predicted sorting bin of a semiconductor device, based on measurement and test data performed on the semiconductor device subsequent to a current metallization layer. The one or more processors determine a target sorting bin for the semiconductor device, wherein the target sorting bin is a higher performance bin than the predicted sorting bin, and wherein the target sorting bin is determined by a machine-learning model that determines a performance level improvement of the semiconductor device attainable by adjustments made to process parameters of one or more subsequent metallization layers of the semiconductor device. The one or more processors generate adjustments for the process parameters of the one or more subsequent metallization layers of the semiconductor device, based on measurement and test data of the current metallization layer of semiconductor device, and the one or more processors adjust the process parameters of the one or more subsequent metallization layer processes of the semiconductor device.

DETAILED DESCRIPTION

Figure 1:
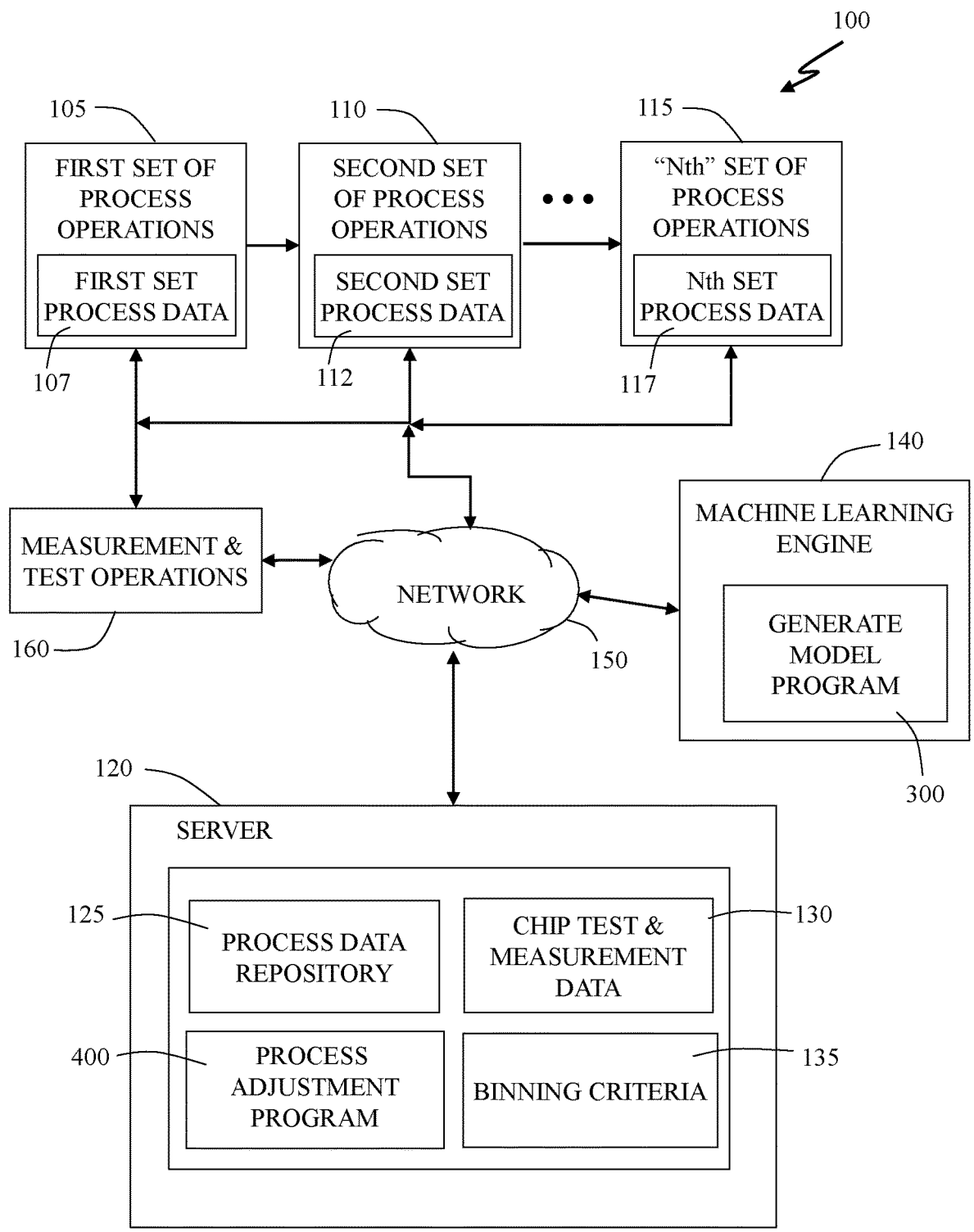
FIG. 1 is a functional block diagram illustrating a distributed data processing environment, in accordance with an embodiment of the present invention.

Embodiments of the present invention recognize that semiconductor integrated circuits, often referred to as IC's, semiconductor devices, or "chips", are designed towards a particular performance standard; however, manufacturing process variations can often produce chips, which are functional but that perform below the designed standard. The performance levels, or characteristics of chips produced from a particular wafer, are obtained by measurement and testing at the completion of manufacturing, also referred to as "fabrication." Semiconductor fabricators have established sorting practices, referred to as "binning," in which chips having particular guaranteed performance levels, or performance properties, are sorted into corresponding "bins," and sold at prices aligned with the particular performance properties of the bin. In this manner, chips performing at the designed highest performance levels command the highest price, whereas chips having the same design, but tested as performing at lower performance levels due to process variations or other effects during fabrication are sorted into lower bins and sold at lower prices.

Binning is commonly practiced among semiconductor fabricators, due to low-yield levels of fabricated chips meeting designed performance levels. By sorting chips into bins of various performance levels, fabricators capture sales revenue from chips that are tested to perform at lower performance thresholds, and priced according to the guaranteed performance level. For example, microprocessor chips are designed to perform at a particular speed of frequency and a particular window of power performance. If testing of fabricated microprocessor chips indicates chip performance at frequencies below their design standard, or operate outside of a designed power window, the microprocessor chip would be designated to a "lower bin" corresponding to a threshold level of speed, frequency, and power criteria that the particular chip is guaranteed to provide. Chips meeting the top level bin performance criteria are sold for top prices, whereas chips in lower bins are priced lower; consistent with the performance criteria associated with their bin.

Embodiments of the present invention provide a method, computer system, and computer program product for optimizing metallization layers during fabrication of a semiconductor device to meet performance levels of a targeted sorting bin, in which the targeted bin designates semiconductor devices having higher performance levels and, therefore, more profitable, than an originally predicted bin for the semiconductor device. The type and amount of optimization of subsequent metallization layers is determined by a trained, machine-learning model receiving in-process measurement and testing data, performed on chips following a metallization layer completion, and prior to a next metallization layer. The optimization of subsequent metallization layers is achieved by feed forwarding of process parameter adjustments to subsequent metallization layer process operations; contributing to improvement of the performance of the semiconductor chips, and thereby improving the designation of the semiconductor chips to higher performance, and more profitable, bins. Adjustment of downstream process operations affect semiconductor device wiring and interconnecting attributes, compensating for device conditions detected by measurement and/or test data in earlier process operations. The additional compensation, included in subsequent metallization layer process operations, improves chip performance results, and enables the semiconductor device to be designated to a higher (increased price) bin, which improves profits for the manufacturer. In some embodiments of the present invention, the process operation adjustments are dynamically determined by a feed-forward mechanism, and automatically applied. In other embodiments the process operation adjustments are dynamically determined and a feed-forward mechanism provides awareness and notification of the adjustments to be made in subsequent metallization layer processes.

Embodiments of the present invention are enabled by machine-learning techniques determining relationships between adjustment to parameter settings of a metallization layer set of process operations, physical and electrical properties of device wiring and interconnections as a result of adjustments to parameter settings, and final semiconductor device measurement and testing of performance. Machine learning of process parameter adjustments are applied to subsequent manufacturing process operations that result in wiring and interconnection features compensating for performance-reducing conditions detected in earlier process measurement and testing operations. Semiconductor device fabrication process parameter data, in-process measurement and test data, final performance test data, and bin performance criteria, are used to generate training data for model development of machine learning. In some embodiments of the present invention, additional empirical processing and testing are performed to further refine and validate the model.

Embodiments of the present invention apply the generated machine learning model to receive semiconductor chip measurement and test data from early manufacturing process operations; for example, a first set of metallization layer operations, and predict which sorting bin the chip aligns to at the current stage of processing based on measurement and test data of the completed metallization layers. For example, for a semiconductor device completing a first metallization layer of processing, the predicted bin for the device may be a third bin, in which a first bin is associated with the top-most bin, having performance criteria meeting the original design of the semiconductor device. The machine learning model predicts the selected bin based on projections from the measurement and test data received for the semiconductor device following a first metallization layer build for the chip, and the known correlation between the measurement and test data, expected finalized chip performance, and the bin-specific performance criteria. Embodiments of the present invention feed-forward process parameter adjustments for one or more subsequent process operations, such as one or more subsequent metallization layer sets of operations, as determined from the machine learning model. The adjustments to subsequent sets of metallization layer process operations are applied as the chip, which has been determined to have degraded performance level due to previous process operations, receives process adjustments during subsequent sets of fabrication process operations. The adjustments provide compensating features of the chip which, when performance tested after chip fabrication completion, may indicate performance levels meeting criteria of a second bin, and commanding a higher sales price than the initial prediction of the third bin.

Embodiments of the present invention are not limited to particular types of semiconductor chips, and may include, for example, microprocessors, memory chips, application specific integrated circuits (ASIC), and other types of chips. For purposes of brevity and clarity, use of "chips" as reference to all types of semiconductor integrated circuits, will hereafter be used; however, the use of the term "chips" is not intended to limit the application and implementation of embodiments of the present invention. In some embodiments of the present invention, semiconductor fabrication processes not directly associated with a metallization layer build may be included in process parameter adjustments made that provide improvement to the performance level of a semiconductor device. Hereafter, for brevity and clarity purposes, in some embodiments, the semiconductor fabrication processes not directly associated with a metallization layer build may be included in references to "process parameters of a metallization layer."

Semiconductor fabrication of integrated circuit (IC) devices involves multiple processing steps performed on a silicon wafer of a particular diameter as a starting substrate. Each silicon wafer includes a multitude of IC chips, depending upon the function, complexity and size of each chip. Circuit patterns and functional features are generated by various patterning, deposition, and subtraction operational steps, and these sets of process operational steps are repeated to add additional layers of functional features and circuit interconnections. The collective set of operational steps to generate a layer of functional features, circuit interconnection, and insulation is often referred to as a metallization layer, or "metallization."

FIG. 1 is a functional block diagram illustrating a distributed data processing environment of semiconductor manufacturing processes, generally designated 100, in accordance with one embodiment of the present invention. The term "distributed" as used in this specification describes a computer system that includes multiple, physically distinct devices that operate together as a single computer system. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

Distributed data processing environment 100 includes first set of process operations 105, second set of process operations 110, and "Nth" set of process operations 115, measurement and test operations 160, machine learning engine 140, and server 120, all interconnected via network 150. Machine learning engine 140 is depicted as including generate model program 300, and server 120 is depicted as including process data repository 125, chip test and measurement data 130, binning criteria 135, and process adjustment program 400.

Network 150 can be, for example, a telecommunications network, a local area network (LAN), a wide area network (WAN), such as the Internet, or a combination of the three, and can include wired, wireless, or fiber optic connections. Network 150 can include one or more wired and/or wireless networks that are capable of receiving and transmitting data, voice, and/or video signals, including multimedia signals that include voice, data, and video information. In general, network 150 can be any combination of connections and protocols that will support communications of process data between first set of process operations 105, second set of process operations 110, and additional sets of process operations represented by "Nth" set of process operations 115, perform measurement and test operations 160, machine learning engine 140, server 120, and other computing devices (not shown) within distributed data processing environment 100.

First set of process operations 105, second set of process operations 110, and "Nth" set of process operations 115 represent respective semiconductor fabrication process steps of multiple operations associated with building a layer of circuitized metallization on a wafer. A non-exhaustive example listing of semiconductor chip process operations includes: lithography patterning of a wafer surface, metallization deposition, chemical/mechanical polishing, doping deposition, insulation deposition, optical measurement, and speed and electrical testing. Each process operation includes parameters and settings that establishes the conditions for the particular process operation. Adjustment of the parameters and settings typically produce changes to the fabrication characteristics of the semiconductor devices, or chips, which are reflected in measurement and test results performed on chips of the wafer. Process operations of chip fabrication may include automated control of parameters and settings, or may provide control performed by manual settings.

First set of process operations 105, second set of process operations 110, and "Nth" set of process operations 115 are depicted as including first set process data 107, second set process data 112, and Nth set process data 117, respectively. Nth set process data 117 is depicted in FIG. 1 to represent one or more additional sets of process operation data associated with building metallization layers on semiconductor chips. Embodiments of the present invention recognize that each subsequent metallization layer set of process operations offers opportunity to compensate for performance-detracting characteristics identified on previous metallization layers. First set process data 107, second set process data 112, and Nth set process data 117 collect parameter and setting data for each wafer processed through a particular set of process steps. In some embodiments of the present invention, first set process data 107, second set process data 112, and Nth set process data 117 retain and store, at least temporarily, the process data and settings associated with each particular processed wafer, including date and time of processing, and may include identifying attributes of the silicon wafer. In other embodiments, first set process data 107, second set process data 112, and Nth set process data 117 retain and store, at least temporarily, the process data associated with individual chips of the particular wafer. In some embodiments, the recorded data from first set process data 107, second set process data 112, and Nth set process data 117 is transmitted to process data repository 125, depicted as included in server 120. In other embodiments, process data repository 125 may be external to, but accessible by server 120 (not shown).

Measurement and test operations 160 includes one or more operations in which various combinations of optical, mechanical, and electrical measurement and testing of the silicon wafer chips is performed. In some embodiments of the present invention, measurement and test operations 160 is performed subsequent to patterning and deposition of a metallization layer, for example, metallization layer 1. Measurement and test operations 160 determines characteristics of chip circuitization associated with the current metallization layer. In some embodiments, measurement and test operations 160 may include, but is not limited to: line height, line width, sidewall angle, insulating liner thickness, line edge roughness (LER), average grain size, capacitance and resistance testing, and after chip fabrication completion, frequency and power consumption testing.

Machine learning engine 140 receives semiconductor fabrication process data from process data repository 125 and receives measurement and test data of semiconductor chips after each metallization layer, from measurement and test operations 160, via network 150. The received data is input to generate model program 300, which builds and trains a machine learning model, which in some embodiments of the present invention, is applied by the operation of process adjustment program 400. In some embodiments of the present invention, machine learning engine 140 is a computing device, communicatively connected to network 150, includes process adjustment program 400, and may include internal and external hardware components, as depicted and described with reference to FIG. 5. In other embodiments, machine learning engine may be integrated within server 120 (not shown).

Generate model program 300 receives process data, measurement and test data associated with chip fabrication for each layer of metallization, and binning data used for sorting completed semiconductor chips, from binning criteria data 135. In some embodiments of the present invention, generate model program 300 determines correlations between sets of process parameters of a chip metallization layer and the measurement and test data results of the chip for the particular layer of metallization, as well as the correlation between applying process adjustments across one or more metallization layers and the criteria employed by the sorting of completed chips into respective performance bins. The determined correlations establish variations in characteristics of a metallization layer of a chip resulting from process parameter variations (i.e., adjustments), and the resulting bin selection for chips, based on measurement and testing data. The correlations form the basic machine learning model, which is further improved by applying training data to the model as supervised learning. In some embodiments, training data includes empirical results obtained by intentional process parameter variation during chip metallization processes, the resulting measurement and testing data, and the known projections of binning designation based on the received measurement and testing data. In some embodiments, training data is generated for each metal wiring level (metallization layer), and used to train the machine learning model which, when trained, is applied by the operation of process adjustment program 400.

For example, a chip fabricator of microprocessor chips designates five binning levels of completed fabrication microprocessors, whose respective criteria is based on frequency performance and power ratings. The example microprocessor chips are designed to include four metallization layers of wiring, gates, etc. For each metallization layer, there are specific wiring designs and sets of process operations, such as first set of process operations 105, second set of process operations 110, third set of process operations (not shown), and Nth set of process operations 115. For each set of process operations, there is a set of process data, such as first set process data 107, second set process data 112, third set process data (not shown), and Nth set process data 117, and corresponding data from measurement and test operations 160, in which the measurement and test data corresponds to the respective set of process operations.

Generate model program 300 generates correlations between process operation parameters from the respective set of process data for each of the four metallization layers, and the corresponding measurement and test operation data from each of the four metallization layers, and in some embodiments includes adjustments to particular wiring designs. The correlations establish an approximate cause-and-effect relationship between parametric settings (adjustments) at key process steps that result in changes to chip wiring feature measurements, which provide functional improvement to the overall chip performance and power ratings.

Continuing with the example, generate model program 300 continues to receive process parameter data, and measurement and test data for each metallization layer, and both the initial projected, and the ultimate sorting bin designation for the fabricated chips. Generate model program 300 continuously applies the on-going received data to the machine learning algorithms of generate model program 300, and continuously improves the model over time. In some embodiments of the present invention, modification to the model, made by generate model program 300, are transmitted to process adjustment program 400 to provide the most accurate model version for process adjustment program 400 operations.

Generate model program 300 generates correlations between the process parameter adjustments, the cumulative characteristic changes of the semiconductor device, and binning criteria. The semiconductor device characteristic changes, for example, circuit line width, which results from process parameter adjustments, and adjustments to process parameters may be applied across multiple metallization layers, providing gradual performance level improvement to the chips with each additional metallization layer. The binning criteria (criteria for sorting chips into "bins"), for completely fabricated chips is used to determine the current predicted sorting bins (initial sorting bins), and the potential projected target sorting bins of the in-process chip. In some embodiments, design adjustments may be made enabling chip characteristic changes to achieve the bin target. In other embodiments additional metallization deposition may be made within an intended metallization layer, or an additional metallization layer outside the original design of the semiconductor chip. The potential target sorting bin is the highest performance, and most profitable bin that is achievable by process/design adjustment. Generate model program 300 is trained by applying sets of training data, which are based on the determined correlations, in which particular process parameter adjustments produce known chip characteristic changes that provide a known level of chip characteristic compensation to achieve a next marketable bin level.

Server 120 can be a standalone computing device, a management server, a web server, a mobile computing device, or any other electronic device or computing system capable of receiving, sending, and processing data. In other embodiments, server 120 can represent a server computing system utilizing multiple computers as a server system, such as in a cloud computing environment. In another embodiment, server 120 can be a laptop computer, a tablet computer, a netbook computer, a personal computer (PC), a desktop computer, a personal digital assistant (PDA), a smart phone, or any other programmable electronic device capable of performing programming instructions and communicating with machine learning engine 140. Server 120 is also capable of communicating with measurement and test operations 160 and machine learning engine 140. Server 120 communicates with first set of process operations 105, second set of process operations 110, and "Nth" set of process operations 115, and in some embodiments of the present invention, server 120 receives process data from sets of process data from semiconductor fabrication operations, such as first set process data 107, second set process data 112, up to Nth set process data 117. Server 120 may also communicate with other computing devices (not shown) within distributed data processing environment 100, via network 150. In another embodiment, server 120 represents a computing system utilizing clustered computers and components (e.g., database server computers, application server computers, etc.) that act as a single pool of seamless resources when accessed within distributed data processing environment 100. Server 120 includes process data repository 125, chip test and measurement data 130, binning criteria 135, and process adjustment program 400. Server 120 may include internal and external hardware components, as depicted and described in further detail with respect to FIG. 5.

Process data repository 125 stores the semiconductor fabrication process parameter data for the set of process operations at each level of chip metallization. In some embodiments of the present invention, process data repository 125 is a storage structure, whereas in other embodiments, process data repository 125 is a storage device. Process data repository 125 associates the particular parameter settings and operation data with a particular wafer of semiconductor chips processed through the operation at a particular date and time, for each layer of metallization, measurement, and testing. The data stored in process data repository 125 is received by generate model program 300 within machine learning engine 140, and used to establish correlations between metallization layer measurement and testing results, and parameter data of process operations during the metallization layer. In some embodiments of the present invention, process data is collected by one or a combination of manual and automated recordings/observations, for example, by first set process data 107, second set process data 112, third set process data (not shown) and Nth set process data 117.

Chip test and measurement data 130 includes stored data collected from measurement and test operations 160 for each metallization layer set of processes during fabrication, and the finished semiconductor chip measurement and test data. In some embodiments of the present invention, chip test and measurement data 130 is the source of chip measurement and test data used by generate model program 300 to generate correlations between process parameter settings of a metallization layer, and the resulting measurement and test data for the previous metallization layer(s). In some embodiments, chip test and measurement data 130 includes end-of-line test and measurement data for fabricated chips and is used for binning operations in which the particular bin to which a chip is assigned for sales is determined. In some embodiments, the measurement and test data includes resistance and capacitance testing in which the product of the tested resistance of the chip and the tested capacitance of the chip is used in determination of chip binning. In some embodiments, generate model program 300 receives measurement and test data, as well as the associated metallization process parameters, and simulates multiple critical paths and outputs a total delay for a given critical path, as part of model training.

Binning criteria 135 includes the measurement and test criteria associated with each bin into which completed semiconductor chips are sorted. The particular criteria associated with a bin designates the fabricator's assertion that chips sorted to that particular bin will meet the specified performance criteria. In some embodiments of the present invention, the performance criteria of binning criteria 135 includes critical delay criteria (i.e., resistance and capacitance product (RC)), in other embodiments, binning criteria 135 may include frequency and power rating criteria, for example, for bins used in sorting chips having completed fabrication. Binning criteria 135 is used by generate model program 300 to determine potential target bins for chips prior to fabrication completion. Binning criteria 135 is used in combination with chip test and measurement data 130 of previous metallization layers of in-process semiconductor chips to determine a next optimal (more profitable) target bin for the in-process chips. After training of generate model program 300, the performance criteria of binning criteria 135 is also used to determine the amount of process parameter adjustment to be made by process adjustment program 400, within each subsequent metallization layer of the in-process chips, to achieve performance criteria matching that of the target bin.

Process adjustment program 400 is enabled by the machine learning training of generate model program 300. The trained machine learning model is applied by operation of process adjustment program 400. In some embodiments of the present invention, the machine learning model is trained to determine a projection of the binning designation for a chip having particular metallization layer characterizations, which correspond to the criteria of the bin. Process adjustment program 400 invokes the trained machine learning model to determine process parameter adjustments that can be manually or dynamically made to subsequent metallization layers of the in-process wafer, which compensates for the previous metallization characteristics that are below design standards. Non-limiting examples of metallization characteristics that may require compensating adjustments to subsequent metallization layers may include RC measurements that fail to meet design minimal values for a top bin designation, excessive narrowing or inadequate structure of circuit wiring, and critical delay measurements exceeding maximum values. Process adjustment program 400 determines an amount of compensation that can be achieved by applying adjustments to subsequent metallization layers, and targets the chips contained in the in-process wafer to meet the most profitable bin level criteria. Process adjustment program 400 improves the projected performance of the wafer chips by applying process parameter adjustments over one or more metallization layers of subsequent metallization and fabrication operations, resulting in compensation to wiring and features of the subsequent metallization layers. The finished chips are now designated to a target bin which is more profitable than the original projection, which was based on previous metallization layer measurement and test data. In some embodiments, adjustments to process parameters are small and evenly distributed at each metallization layer, accounting for small process windows, and benefitting from a cumulative effect.

For example, a wafer of chips receives measurement and test data after a metallization layer that indicates, based on the generated machine learning model, that the finished chips will be designated to a third bin having lower performance criteria than the top two sorting bins. Process adjustment program 400 determines adjustments to be made during the one or more subsequent metallization layer processing that will achieve the performance criteria associated with a target bin, such as the second bin, which is more profitable than the third bin. For each subsequent metallization layer, the measurement and test data is received by process adjustment program 400, and subsequent metallization layer process adjustments are determined as necessary to achieve the highest bin performance level attainable by the cumulative process adjustments. In some embodiments of the present invention, process adjustment program 400 provides adjustment information that can be applied to one or more of the metallization layer processes. In other embodiments, process adjustment program 400 is connected to controlling devices of the subsequent metallization layer processes, enabling particular adjustments to be automatically applied to respective wafers.

Figure 2A:
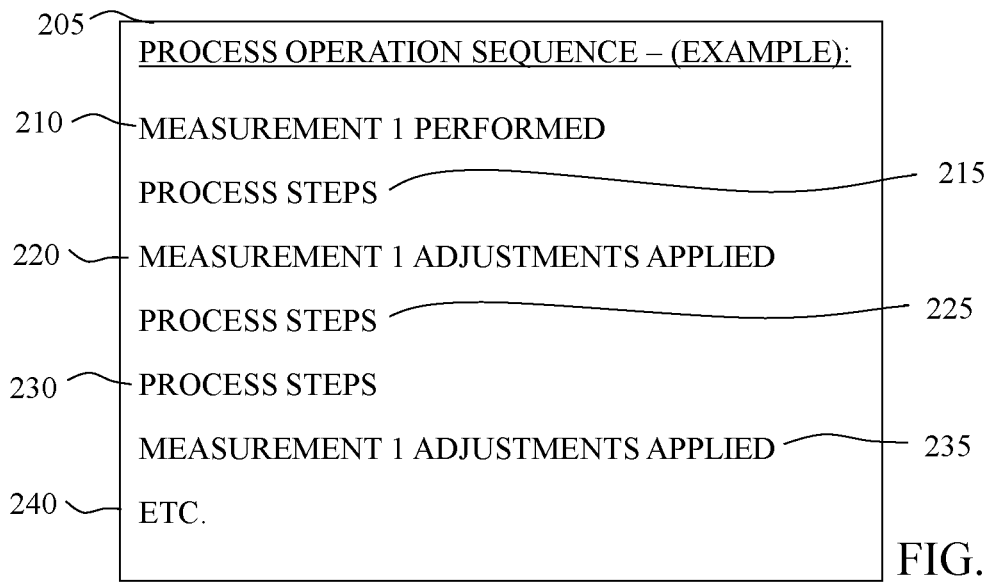
FIG. 2A depicts a process operation sequence of semiconductor chip fabrication, in accordance with an embodiment of the present invention.

FIG. 2A depicts process operation sequence 205 of semiconductor chip fabrication, in accordance with an embodiment of the present invention. Process operation sequence 205 outlines a sequence of steps of semiconductor chip fabrication. For brevity, FIG. 2A summarizes multiple manufacturing process steps under the terms "process steps," without explicitly listing individual steps. One of ordinary skill in the art of semiconductor chip fabrication will recognize the processing steps implied by the outline, without departing from the scope of the invention as recited by the claims and described herein by embodiments of the present invention.

Process sequence step: "measurement 1 performed 210," represents the measurement and test operations performed on a metallization layer of a wafer of semiconductor chips. The measurement data may include measurement of circuit line width, line height, sidewall angle, thickness of lining materials, average grain size, and line edge roughness, resulting from the metallization layer applied to the wafer. In some embodiments, the measurements may be performed by optical machine operations. In other embodiments, the measurements may be performed manually, or in some combination of optical machine and manual measurements. Test data may include RC measurements, and critical delay (CD) measurements, for example, as well as other electrical test data.

Process sequence step: "process steps 215" represents additional process steps, which may be, for example, process steps associated with preparation for an additional metallization layer of chips on a wafer being processed. Semiconductor fabrication process steps typically begin with a high-purity silicon wafer, onto which via and trench patterns are applied by depositing dielectric material on the wafer, producing patterns by lithography operations, and etching away material to expose the vias and trenches. In some embodiments, a diffusion barrier layer, typically Ta l andalum-based, is deposited in the vias and trenches, followed by a thin seed layer. The vias and trenches are filled, in some embodiments, by electroplating, and excess plating is removed by chemical-mechanical polishing. In other embodiments vapor deposition methods may be used to produce metal-filled via and line trenches. In some embodiments of the present invention, a layer of metallization includes operations for measurement of trench, via, and other features of a metallization layer, as well as testing of the properties and performance of the metallization layer.

Process sequence step: "measurement 1 adjustments applied 220" represents the application of process parameter adjustments determined by process adjustment program 400 to process steps of a subsequent metallization layer for the fabrication of chips on the silicon wafer. Process adjustment program 400 applies the process adjustments to particular process operations, based on the trained machine learning model of generate model program 300. The chips in-process are designed to meet the performance threshold of the top level sorting bin once all fabrication operation steps are complete. The adjustments are applied to subsequent metallization layer process steps in response to determining that the semiconductor chips on the wafer being processed are projected to be sorted to a bin having a performance criteria threshold below the top level bin, based on the results from "measurement 1 performed 210". In some embodiments of the present invention, the adjustments result in small changes to a subsequent metallization layer that improves the performance of the semiconductor chips towards the targeted sorting bin criteria. The performance criteria of a sorting bin may include one or a combination of: critical path duration (delay), processing speed, frequency, reliability, power consumption, and special featured functions.

"Process steps 225" include fabrication processes for a current metallization layer for chips on the in-process wafer that have adjustments applied to respective process parameters. The adjustments result in changes to the chips on the wafer that improves the performance of the chips relative to the previous metallization layer measurement and test data. "Process steps 230" include fabrication processes for completing the current metallization layer for chips on the in-process wafer. "Measurement 1 adjustments applied 235" represents a subsequent set of process operations to which adjustments are applied. In some embodiments of the present invention, "measurement 1 adjustments applied 235" are applied to a next subsequent metallization layer. In some embodiments, "measurement 1 adjustments applied 235" are applied to processes determined by process adjustment program 400 that result in improvement of chip performance towards the targeted sorting bin criteria. The subsequent process sequence, "Etc. 240," represents iterative performance of process steps and application of adjustments for metallization layers, based on results of "measurement 1 performed 210". The compensation to wiring characteristics resulting from adjustments applied to each metallization layer of chips on the in-process wafer are cumulative across the multiple metallization layers. The cumulative effects from applied adjustments results in chip performance meeting or exceeding the target sorting bin performance criteria threshold, and chips that are sorted to the targeted bin.

Figure 2B:
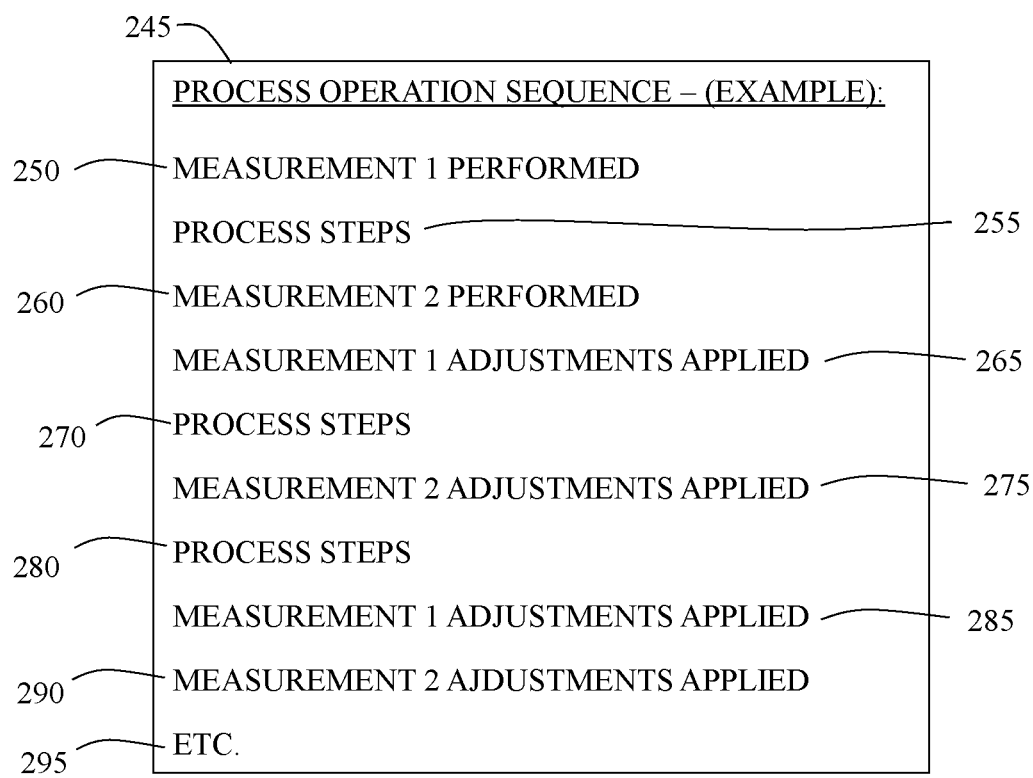
FIG. 2B depicts a process operation sequence of semiconductor chip fabrication, in accordance with an embodiment of the present invention.

FIG. 2B depicts "process operation sequence 245" of semiconductor chip fabrication, in accordance with an embodiment of the present invention. "Process operation sequence 245" illustrates an example sequence of multiple measurement and test input used in determining and applying process parameter adjustments to multiple metallization layers to achieve improved performance of fabricated semiconductor chips meeting a targeted sorting bin. For brevity, FIG. 2B summarizes multiple fabrication process steps, without explicitly listing individual steps, under the terms "process steps." "Process operation sequence 245" includes a combination of performing a first and a second measurement associated with metallization layers of chips on an in-process wafer and applying adjustments to subsequent processes based on the first and second measurements, respectively.

Process sequence step: "measurement 1 performed 250," represents the measurement and test operations performed on a metallization layer of a wafer of semiconductor chips. The measurement data may include measurement of pattern dimensions and lining thickness resulting from a metallization layer applied to the wafer. In some embodiments of the present invention, measurement and test results may be automatically performed and recorded, whereas in other embodiments the measurements and tests may be performed manually, or in some combination of automated and manual operations. Test data may include RC measurements, and critical delay (CD) measurements, for example, as well as other electrical test data.

Process sequence step: "process steps 255" represents process steps associated with completion of the previous metallization layer after measurement and testing, and building of a subsequent metallization layer of chips on the in-process wafer. "Measurement 2 performed 260" is an additional measurement and test operation, which in one embodiment of the present invention, is performed after "process steps 255" as part of completing the previous metallization layer, and in other embodiments, "measurement 2 performed 260" occurs after a subsequent metallization layer completed by "process steps 255."

Process sequence step: "measurement 1 adjustments applied 265" is a step in operation sequence in which process adjustments are applied to process parameters of a next subsequent metallization layer by process adjustment program 400. The process adjustments are based on "measurement 1 performed 250" results and determining the potential target bin achievable by process adjustment applied to subsequent metallization layers of chips on the in-process wafer. The next subsequent metallization layer may be built by performing "process steps 270." In process sequence step: "measurement 2 adjustments applied 275," process adjustment program 400 applies process parameter adjustments to the next subsequent set of metallization process operations, based on measurements and test data received from "measurement 2 performed 260."

"Process steps 280" builds an additional subsequent metallization layer, and in "measurements 1 adjustments applied 285," and "measurements 2 adjustment applied 290," process adjustment program 400 applies parameter adjustments to "process steps 280" based on both "measurement 1 performed 250" and "measurement 2 performed 260." "Process operation sequence 245" illustrates an example embodiment in which multiple measurements are performed and combinations of adjustments, based on the multiple measurements, are applied to achieve semiconductor chip performance meeting the threshold criteria of the targeted bin. "Etc. 295" illustrates an iterative aspect of the example, in which multiple metallization layers are employed to compensate for predicted performance degradation from previous metallization layer measurement and test.

Figure 3:
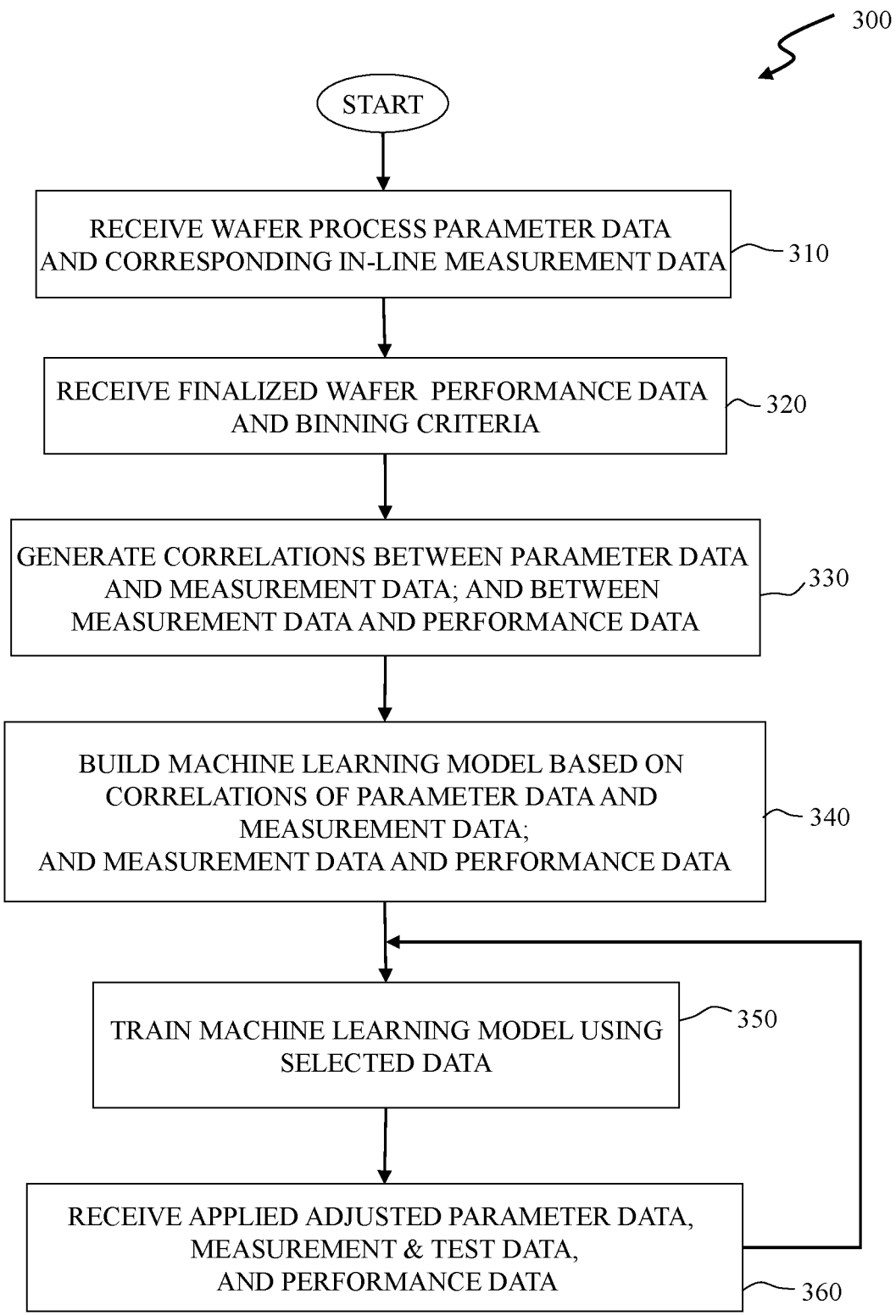
FIG. 3 is a flowchart depicting operational steps of a model generation program, inserted on a computing device of the distributed data processing environment of FIG. 1, to generate and train a model for determining adjustments to be made to subsequent metallization layers of semiconductor chips, enabling a more profitable bin to be targeted, in accordance with an embodiment of the present invention.
Figure 4:
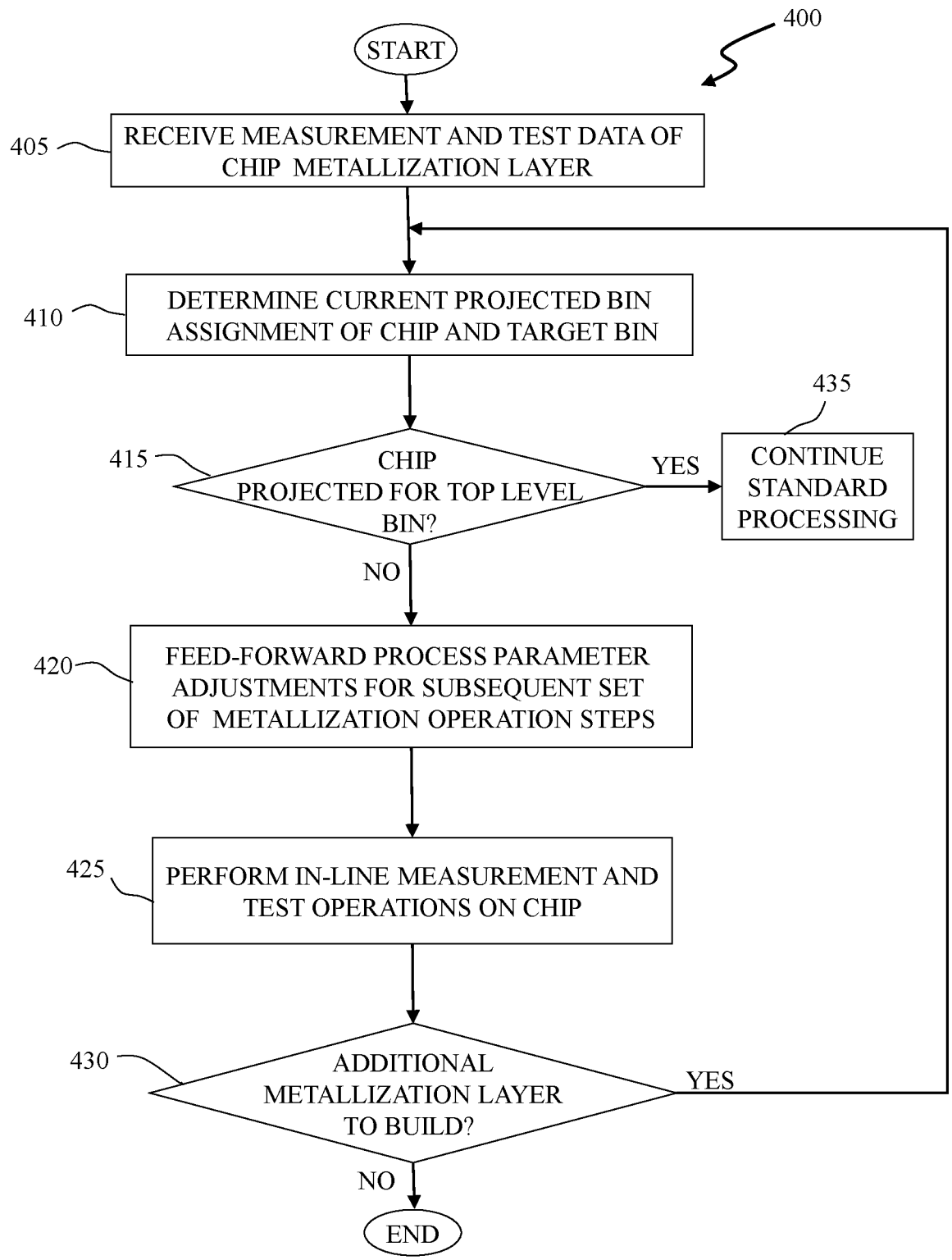
FIG. 4 is a flowchart depicting operational steps of a process adjustment program, operating on a server within the distributed data processing environment of FIG. 1, to determine process adjustments to apply to subsequent metallization layers of semiconductor chips, achieving a more profitable target bin, in accordance with an embodiment of the present invention.

FIG. 3 is a flowchart depicting operational steps of generate model program 300, in some embodiments, operating on machine learning engine 140, to generate and train a model for determining adjustments to be made to subsequent metallization layers of semiconductor chips, enabling a more profitable bin to be targeted, in accordance with an embodiment of the present invention. Generate model program 300 determines a series of correlations. Correlations between fabrication process parameter settings and the resulting physical and functional characteristics of semiconductor chips; correlations between the physical and functional characteristics from parameter settings, and metallization layer test results; correlations between metallization test results and performance improvement; and correlations between attainable performance improvement across one or more chip metallization layer builds, and sorting bin performance criteria. The determined correlations serve as an initial basis for a machine learning model which is further trained based on supervised learning. The trained model is continually improved by generate model program 300 receiving the applied adjusted process parameter data, resulting measurement and test data, and end-of-build performance data, as on-going training data. The machine learning model is continually re-trained based on generate model program 300 receiving the applied adjusted process parameter data, resulting measurement and test data, and end-of-build performance data as either supervised or unsupervised training of the model.

Generate model program 300 receives wafer process parameter data and corresponding in-line measurement data (step 310). Generate model program 300 receives process parameter data for a metallization layer build, and measurement and test data associated with the layer of metallization. Generate model program 300 receives the parameter data of each process operation, and measurement and test data, for each of the metallization layers included in the semiconductor chip fabrication. In some embodiments of the present invention, generate model program 300 receives process parameter data, and measurement and test data from first set process data 107, second set of process data 112, and Nth set process data 117. In other embodiments, process parameter data, and measurement and test data is obtained from process data repository 125 of server 120.

For example, a first metallization layer may include surface preparation steps, lithography image patterning steps, etching, deposition, and polishing steps, as first set of process operations 105. Generate model program 300 receives the parametric settings first set process data 107 from first set of process operations 105. Generate model program 300 also receives data from measurement and test operations 160, which corresponds to the metallization layer steps of first set of process operations 105. Generate model program 300 receives the process parameter data, and measurement and test data for each metallization layer performed on the wafer for the semiconductor chip build.

Generate model program 300 receives finalized wafer performance data and binning criteria (step 320). Subsequent to receiving the process parameter data, and measurement and test data for each of the metallization layer builds for the wafer, performance data for finalized chips is received by generate model program 300. In some embodiments of the present invention, performance data may include one or a combination of frequency levels, power consumption, critical delay timing, and RC values. In some embodiments, performance data is a result of the design and pattern dimensions, silicon wafer properties, and the metallization physical and functional characteristics resulting from applied process parameter settings and conditions. In some embodiments, generate model program 300 receives chip performance data from chip test and measurement data 130 and binning criteria data from binning criteria 135. Binning criteria 135 includes the performance threshold values for chips to be sorted to a particular bin. Binning criteria may depend upon the type of semiconductor chip being sorted. For example, a microprocessor chip may have binning criteria thresholds for frequency and power rating/consumption.

Generate model program 300 generates correlations between parameter data and measurement and test data, as well as correlations between measurement and test data and performance data (step 330). The correlations generated by generate model program 300 link the parameter data of fabrication processes to the measurement and test data of a particular metallization layer, and ultimately link the cumulative measurement and test data of multiple metallization layers to the overall chip performance data. The correlations generated enable the basis of a machine learning model in which the effects of process parameter adjustment can predict relative performance improvement to semiconductor chips. In some embodiments of the present invention, process parameter data is correlated to physical and functional characteristics of chips on a wafer during semiconductor fabrication. Generate model program 300 correlates physical and functional characteristics of chips to metallization layer measurement and test results, and further correlates the measurement and test results to finalized chip performance data.

For example, generate model program 300 receives a multitude of sets of process data from multiple metallization layer operations across multiple wafers processed for semiconductor chip fabrication. Process data is correlated with measurement and test data for each set of metallization layer operations performed. Generate model program 300 establishes correlation relationships between the process parameters and the measurement and corresponding in-process test data for the metallization layer. The correlations establish the relative effect of process parameter (and design) settings on measurement and test data. Generate model program 300 further establishes correlation relationships between iterations of measurement and test results across multiple metallization layer builds, and resulting overall performance of the finalized semiconductor chip.

Generate model program 300 builds a machine learning model based on the correlations of process parameter data and measurement data; and correlations between measurement data and performance data (step 340). The machine learning model structure is based on the determined correlations discussed above, as well as determining cumulative effects of parameter adjustments performed on multiple metallization layer builds towards improvement in finalized chip performance. Generate model program 300 determines the type and degree of parameter adjustments per metallization layer that correspond to improving chip performance, by compensating wiring properties in subsequent metallization layer builds. The correlation-based build of the machine learning model serves as a starting point, which is subsequently refined and improved.

For example, the measurement and test data of a metallization layer result from a particular set of parameter settings and/or variations within process operations. Generate model program 300 determines that adjustments to particular process operation steps in the next three metallization layers will provide a particular level of improvement to the test data, based on previously determined correlations. Generate model program 300 further determines the cumulative improvement in test data corresponds to a particular amount of improvement to finalized chip performance data, based on generated correlations.

In some embodiments of the present invention, generate model program 300 receives binning data of previously fabricated semiconductor chips, and associates the binning data with the measurement and test data associated with the metallization layers of the chips. The binning data, along with the bin criteria data and the known parameter adjustment effect on measurement and test data of metallization layers, is used by generate model program 300 to train the machine learning program in determining potential target bins attainable by inducing performance improvement of chips through process parameter adjustments across one or more metallization layer builds.

Generate model program 300 trains the machine learning model using selected data (step 350). In some embodiments of the present invention, metallization layer process parameters are intentionally varied, and associated with resulting measurement and test data, as well as the cumulative adjustment outputs of process parameters on metallization wiring across multiple metallization layers, to train the machine learning model. In other embodiments, the machine learning model is trained by selective adjustments to process parameters to be applied to subsequent metallization layers, producing known relative measurement and test data changes, and known cumulative effects of chip performance improvement. In some embodiments, selected process adjustment data is applied to the machine learning model as supervised learning, in which the model is modified to more closely reflect the known training data cause-and-effect relationships. In some embodiments, the machine learning model is trained to determine process parameter selection and adjustment magnitude based on consideration of cumulative effects of process parameter adjustments of multiple metallization layers in the build of a finalized semiconductor chip. In some embodiments, adjustment to metallization pattern design and material selection are included in the process parameter adjustment considerations to compensate, in subsequent metallization layers, for detection of wiring properties and test results of previous metallization layers that may otherwise result in sorting the fabricated semiconductor chips to bins designated as lower performance and/or lower reliability levels. The machine learning model trained by generate model program 300 is available and accessible by process adjustment program 400.

Generate model program 300 receives applied adjusted parameter data, measurement and test data, and performance data of fabricated semiconductor chips (step 360). The machine learning model is continuously modified and improved by generate model program 300 receiving process parameter data, measurement and test data, and finalized chip performance data of on-going fabrication of semiconductor chips. The data is applied to continually train the machine learning model (loop to step 350), and accommodates small process or design shifts that may occur through time, and generate model program 300 continues to operate as described above.

Process adjustment program 400 operates the machine learning model generated by generate model program 300 and determines process parameter adjustments to apply to subsequent semiconductor metallization layers, based on in-process measurement and test data received from one or more previous metallization layers. Process adjustment program 400 predicts the initial (or current), sorting bin designation for in-process semiconductor chips, and determines the most profitable target bin for the chips attainable by process parameter adjustments applied to subsequent metallization layer builds. In some embodiments of the present invention, process adjustment program 400 re-assesses the target bin for the in-process semiconductor chips at each metallization layer, and dynamically modifies process parameter adjustments to achieve the most profitable bin designation for the chips, which may include modifying the target bin for the in-process chips.

Process adjustment program 400 receives measurement and test data of semiconductor chip metallization layer (step 405). Measurement and test data corresponding to design and process parameters of a metallization layer of semiconductor chip fabrication are received and analyzed by process adjustment program 400, indicating properties predictive of finished product performance. The measurement and test data are captured at various metallization process operation steps determined to influence the electrical and functional performance of the semiconductor chips. For example, process adjustment program 400 receives wiring width and thickness measurements, as well as line edge roughness measurements, and RC test values for a completed metallization layer of a semiconductor chip wafer. The wiring width and thickness, and line edge roughness measurements may indicate conductivity and signal propagation properties, and resistance and capacitance product test values may indicate delay time properties. The indicated properties are used by process adjustment program 400 in predicting likely bin designations for the chips.

Process adjustment program 400 determines a predicted current sorting bin assignment of semiconductor chips and determines a projected target sorting bin for the chips (step 410), compensated with subsequent metallization process parameter adjustments. Based on the machine learning model generated by generate model program 300, process adjustment program 400 predicts the sorting bin designation of the in-process chips based on the measurement and test data received from the previous metallization layer, (without consideration of potential wiring compensation from process parameter adjustments). The current sorting bin is a designation the chip is given if the performance of the chip remains at the level indicated by the current metallization measurement and test data. The projected target sorting bin is determined by process adjustment program 400, based on the predicted current sorting bin, and determining the extent of compensating changes to subsequent metallization layers that can be attained by applying adjustments. Process adjustment program 400 considers the subsequent layers of metallization available to which the process adjustments can be applied, and the potential compensating changes that can be attained during each metallization layer build. In some embodiments of the present invention, the predicted current sorting bin and the projected target sorting bin determinations are performed prior to each non-final metallization layer. In each case, the semiconductor chips are targeted to the most profitable bin having a performance criteria threshold attainable by the adjustment-compensated chips.

Process adjustment program 400 determines whether chips are projected for the top level sorting bin (decision step 415), and determining that chips are projected for the top level bin (step 415, "YES" branch), process adjustment program 400 enables continuation of standard process parameter settings without intervening with compensating process parameter adjustments (step 435). Chips projected for top level bin designation meet the highest performance level criteria and, therefore, do not require additional compensating process parameter adjustments in a subsequent metallization layer build. In some embodiments of the present invention, if process adjustment program 400 determines the chip to be projected for bins having performance criteria below that of the top bin, as a result of measurement and/or test data from a subsequent metallization layer, process adjustment program 400 may provide compensating process parameter adjustment during one or more remaining metallization layer builds of the semiconductor chips.

For the case in which process adjustment program 400 determines that the chips are projected for bins other than the top level bin (step 415, "NO" branch), process adjustment program 400 proceeds to feed-forward process parameter adjustments for one or more subsequent sets of metallization layer process steps (step 420). Process adjustment program 400, enabled by the machine learning model, determines a type and amount of compensating changes required in one or more subsequent (future) metallization layer builds for the chips, and feed-forwards the process parameter adjustment criteria to appropriate metallization process steps. In some embodiments of the present invention, the adjustments are implemented across multiple process steps, and across multiple metallization layers, providing a cumulative compensating effect, and accommodating potential small process window adjustments.

In some embodiments, the feed-forward of process parameter adjustments are made known by notifications to users associated with the particular process operations for which adjustment information is made available for users to implement the adjustments. In other embodiments, process adjustment program 400 provides feed-forward of process parameter adjustment data directly to process operation controlling devices. In some embodiments, the process adjustments may include adjustments to wiring designs and patterns, and in other embodiments, process adjustments may include adjustments to an amount of metallization and/or insulating depositions, or include additional metallization layers, not originally designed.

For example, having determined from a post-metallization layer set of measurement and test data that in-process chips are projected for designation to a third bin from the top performance bin, process adjustment program 400 determines the types and amounts of adjustments, and the particular process operations to receive adjustments, to compensate for chip properties that have reduced projected performance to a third bin designation. Process adjustment program 400 determines that adequate compensation can be provided in subsequent metallization layers to target the chips to the second bin from the top performance level bin as the most profitable attainable bin. Process adjustment program 400 also considers the number of subsequent metallization layers remaining in the semiconductor chip fabrication and generates adjustment outputs of process parameters for a subsequent metallization layer. Process adjustment program 400 transmits the adjustment outputs by feed-forwarding the adjustments to respective processes to provide compensating changes to the chips towards attain the performance level qualifying the chips for the second bin from the top performance bin. In some embodiments, the feed-forward adjustments include notification and details to implement the adjustments at the indicated process operation, and for the indicated metallization layer build of the respective wafer. In some embodiments, the feed-forward adjustments are automatically transmitted to, and applied by a controlling device for a metallization layer process.

Having determined and provided (by feed-forwarding), process parameter adjustments for subsequent metallization operations steps, process adjustment program 400 performs measurement and test operations on the in-process semiconductor chips (step 425). The process parameter adjustments for designated operation steps of a next metallization layer build of the respective wafer are applied, and provide an amount of compensation towards attaining a more profitable bin than the projected bin designation for the chips. Measurements and tests are performed subsequent to the metallization layer build, and process adjustment program 400 receives the measurement and test data. The measurement and test data performed after completing an adjusted parameter metallization layer indicate, or correlate to, an amount of improvement to the chips, which can be translated to a projected performance level, and compared to criteria associated with a particular sorting bin.

For example, having completed a second metallization layer in which process adjustment program 400 feeds-forward parameter adjustments that are applied to process operation steps, measurement and test operations are performed on the in-process semiconductor chips, and the data is received by process adjustment program 400. The measurement data may include wiring line width, shape, thickness, edge roughness, grain structure size, etc. Test data may include electrical tests, such as RC values, frequency, power, and timing tests.

Process adjustment program 400 determines whether there are additional metallization layers yet to build for the in-process semiconductors (decision step 430). Additional metallization layers yet to build offer opportunity to modify process parameters and compensate during subsequent metallization layer steps for previous metallization layer results projecting reduced performance. For the case in which process adjustment program 400 determines that no additional metallization layers remain to be built, (and additional layers outside original designs are not possible) (step 430, "NO" branch), process adjustment program 400 ends, and the semiconductor chips proceed to final operational steps and binning designation.

For the case in which process adjustment program 400 determines that additional metallization layers are to be built (or additional metallization layers outside original designs are possible) (step 430, "YES" branch), process adjustment program 400 proceeds to determine the current predicted sorting bin assignment of the chip, and the projected target bin of the chip (step 410) and continues as described above.

In some embodiments of the present invention, process adjustment program 400 may determine that a projected target sorting bin is attainable as a result of completed metallization layers that included adjustment of process parameters, and also determine that the next most profitable bin is not attainable, even though additional metallization layers are to be built. Process adjustment program 400 may omit adjustments to the subsequent metallization layer processing (not shown).

Figure 5:
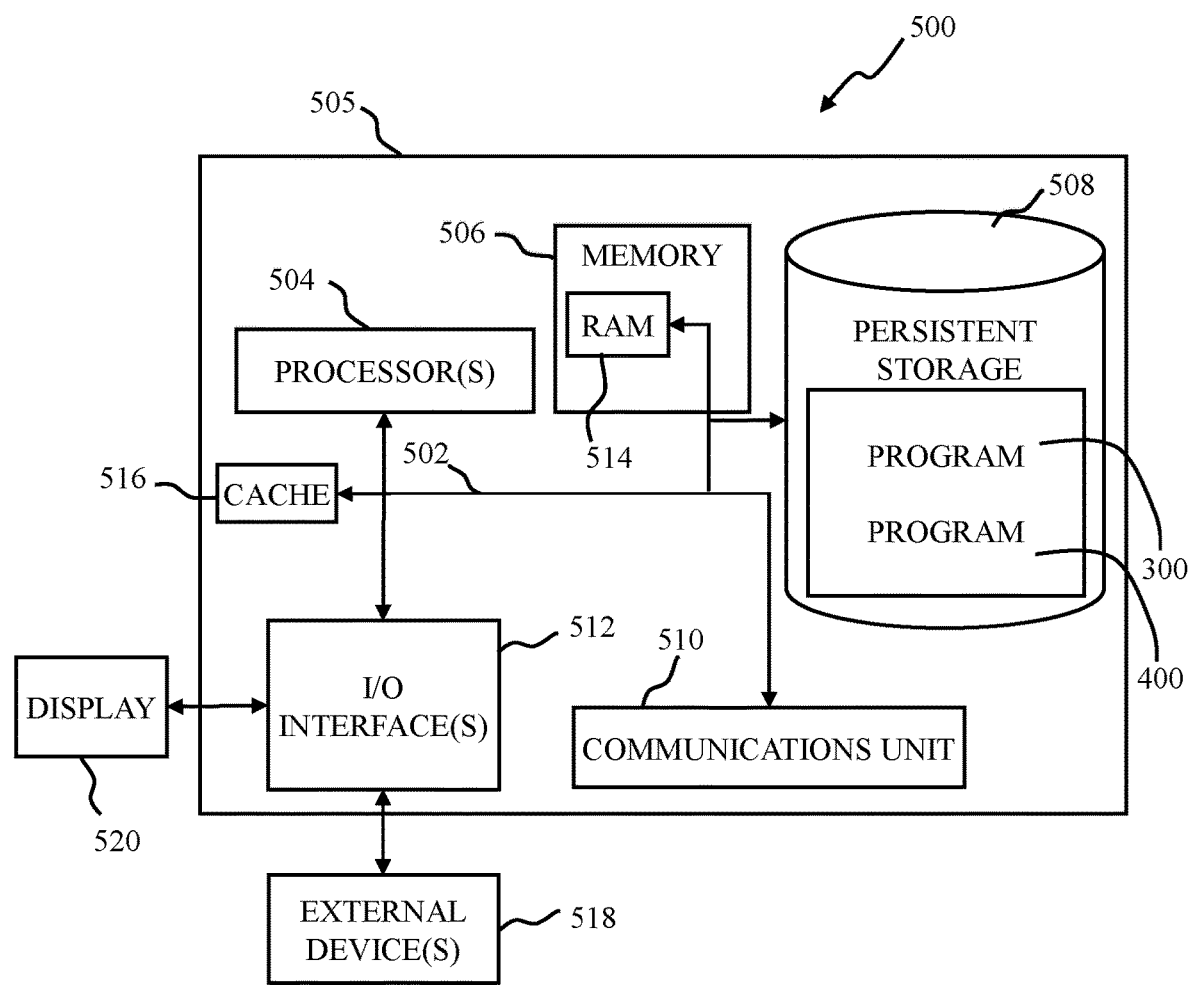
FIG. 5 depicts a block diagram of components of a computing device capable of operationally performing the generate model program and process adjustment program, in accordance with an embodiment of the present invention.

FIG. 5 depicts a block diagram of components of computer system 500, which includes computing device 505. Computing device 505 is capable of operating generate model program 300, and process adjustment program 400, and includes components and functional capability similar to server 120 and computing devices including machine learning engine 140 (FIG. 1), in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

Computing device 505 includes communications fabric 502, which provides communications between computer processor(s) 504, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506, cache memory 516, and persistent storage 508 are computer readable storage media. In this embodiment, memory 506 includes random access memory (RAM) 514. In general, memory 406 can include any suitable volatile or non-volatile computer readable storage media.

Generate model program 300 and process adjustment program 400 are stored in persistent storage 508 for execution by one or more of the respective computer processors 504 via one or more memories of memory 506. In this embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 510, in these examples, provides for communications with other data processing systems or devices, including resources of distributed data processing environment 100, such as measurement and test operation 160, and machine learning engine 140. In these examples, communications unit 510 includes one or more network interface cards. Communications unit 510 may provide communications through the use of either or both physical and wireless communications links. Generate model program 300 and process adjustment program 400 may be downloaded to persistent storage 508 through communications unit 510.

I/O interface(s) 512 allows for input and output of data with other devices that may be connected to computing system 500. For example, I/O interface 512 may provide a connection to external devices 518 such as a keyboard, keypad, a touch screen, and/or some other suitable input device. External devices 518 can also include portable computer readable storage media such as, for example, thumb drives, portable optical or magnetic disks, and memory cards. Software and data used to practice embodiments of the present invention, e.g., generate model program 300 and process adjustment program 400, can be stored on such portable computer readable storage media and can be loaded onto persistent storage 508 via I/O interface(s) 512. I/O interface(s) 512 also connect to a display 520.

Display 520 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for generating a machine learning model for improving performance levels of semiconductor devices during fabrication, the method comprising:

determining, by one or more processors, a first set of correlations between process parameters applied to a metallization layer process of semiconductor device fabrication and data from measurement and test operations performed subsequent to the metallization layer of the semiconductor devices, for a plurality of metallization layers performed during fabrication of a plurality of semiconductor devices;

determining, by one or more processors, a second set of correlations between the data from measurement and test operations performed subsequent to the metallization layer of the semiconductor devices and predicted performance level of the semiconductor devices;

generating a machine learning model, based on the first set of correlations and the second set of correlations; and training the machine learning model to:

determine an initial sorting bin, a target soring bin, and a current sorting bin of a first semiconductor device, and determine adjustments to process parameters of a subsequent metallization layer that improve the performance levels of the first semiconductor device by compensating for performance-reducing conditions detected by prior process measurement and testing operations.

2. The method of claim 1, wherein determining the initial sorting bin and determining the current sorting bin of the first semiconductor device includes projecting a performance level of the first semiconductor device in which the performance level includes measurement of a combination from a group of: resistance and capacitance, critical path delay, processing speed, frequency, reliability, power consumption, and special featured functions.

3. The method of claim 1, wherein adjustments to process parameters of subsequent metallization layers are determined based on the remaining number of metallization layers for the first semiconductor device, an amount of compensating improvement attainable from cumulative adjustments to process parameters of a metallization layer, and a determined amount of performance improvement to meet performance criteria of the target sorting bin.

4. The method of claim 1, wherein the machine learning model determines the highest performance target sorting bin attainable by applying adjustments to subsequent metallization layers for the first semiconductor device, and wherein the subsequent metallization layer is one of multiple metallization layers performed in fabrication of the first semiconductor device.

5. The method of claim 1, wherein an adjustment to subsequent metallization layer process parameters includes an adjustment to a design of the first semiconductor device.

6. The method of claim 1, wherein the measurement and testing of performance data includes one or a combination from a group consisting of: mechanical measurements, optical measurements, electrical measurements, manual testing, optical testing, and electrical testing.

7. The method of claim 1, wherein the determination of the initial sorting bin, the target sorting bin, and a current sorting bin of the first semiconductor device, as well as the determination of the adjustments to process parameters of a subsequent metallization layer that are predicted to improve the physical and electrical performance levels of the first semiconductor device, are based on the first set of correlations, the second set of correlations, and the determined current sorting bin of the first semiconductor, and by performing supervised learning techniques on the machine learning model utilizing the metallization layer process parameter data, data from measurement and test operations performed, and performance level data obtained from a plurality of wafers during fabrication of multiple semiconductor devices.

8. The method of claim 1, wherein data applied to the machine learning model during supervised learning techniques includes empirical results obtained by intentional process parameter variation during chip metallization processes, the resulting measurement and testing data, and the known projections of binning designation based on the received measurement and testing data of the plurality of semiconductor devices.

9. A method for improving a performance level of a semiconductor device, the method comprising:
determining, by one or more processors, a predicted sorting bin of a semiconductor device, based on data from measurement and test operations performed on the semiconductor device subsequent to a current metallization layer;
determining, by one or more processors, a target sorting bin for the semiconductor device, based on the data from measurement and test operations performed on the semiconductor device and a machine learning model that determines an attainable performance level improvement based on adjustments to process parameters of subsequent metallization layers of the semiconductor device;
identifying, by one or more processors, process parameter adjustments to the subsequent metallization layers of the semiconductor device; and
applying, by one or more processors, the adjustments to the process parameters of the subsequent metallization layer processes of the semiconductor device.

10. The method of claim 9, wherein the adjustments to the process parameters of the subsequent metallization layer processes are determined by the machine learning model and, wherein cumulative adjustment outputs across multiple metallization layers provides performance improvement of the semiconductor device to at least meet performance criteria of the target sorting bin for the semiconductor device.

11. The method of claim 9, wherein a feed-forward mechanism transmits a notification including the process parameter adjustments for respective processes of a subsequent metallization layer of the semiconductor device as user awareness for manual setup.

12. The method of claim 9, wherein a feed-forward mechanism automatically transmits the adjustments for the process parameters of the subsequent metallization layers of the semiconductor device to respective processes of the subsequent metallization layers of the semiconductor device.

13. The method of claim 9, wherein the adjustments to process parameters of the subsequent metallization layers include adding additional metallization layers for the semiconductor device.

14. The method of claim 9, wherein the adjustments to the process parameters includes adjustments to design patterns of the semiconductor device.

15. The method of claim 9, wherein a feed-forward mechanism continuously re-trains the machine learning model by program instruction to transmit to the machine learning model adjustments for the process parameters of the one or more subsequent metallization layers, performance level testing data of the semiconductor device, and sorting bin designations associated with the semiconductor device.

16. The method of claim 9, wherein the determination of a predicted current sorting bin and the target sorting bin is performed prior to each metallization layer.

17. A computer system for generating a machine learning model for improving performance levels of semiconductor devices during fabrication, the computer system comprising:
one or more computer processors,
one or more computer readable storage media,
program instructions stored on the computer readable storage media for execution by at least one of the one or more processors, the program instructions comprising:
program instructions to determine a first set of correlations between process parameters applied to a metallization layer of semiconductor devices, and data from measurement and test operations performed subsequent to the metallization layer of the semiconductor devices, for a plurality of metallization layers performed during fabrication of a plurality of semiconductor devices;
program instructions to determine a second set of correlations between the data from measurement and test operations performed subsequent to the metallization layer of the semiconductor devices and predicted performance level of the semiconductor devices;
program instructions to generate a machine learning model, based on the first set of correlations and the second set of correlations;
program instructions to train the machine learning model to determine an initial sorting bin, a target sorting bin, and a current sorting bin of a first semiconductor device, and program instructions to train the machine learning model to determine adjustments to process parameters of one or more subsequent metallization layers of the first semiconductor device that improves the performance level of the first semiconductor device by compensating for performance-reducing conditions detected in earlier process measurement and testing operations.

18. The computer system of claim 17, wherein program instructions to determine a current sorting bin of a first semiconductor device includes projecting a performance level of the first semiconductor device in which the performance level includes measurement of a combination from a group of: resistance and capacitance, critical path delay, processing speed, frequency, reliability, power consumption, and special featured functions.

19. The computer system of claim 17, wherein program instructions to determine an initial sorting bin, a target sorting bin and a current sorting bin of the first semiconductor device, as well as program instructions to determine the adjustments to process parameters of a subsequent metallization layer that are predicted to improve the physical and electrical performance levels of the first semiconductor device, are based on the first set of correlations, the second set of correlations, and the determined current sorting bin of the first semiconductor, and by performing supervised learning techniques on the machine learning model utilizing the metallization layer process parameter data, the measurement and testing of performance data, and performance level data obtained from a multitude of wafers during fabrication of multiple semiconductor devices.

20. The computer system of claim 17, wherein data applied to the machine learning model during supervised learning techniques includes empirical results obtained by intentional process parameter variation during semiconductor metallization processes, resulting data from measurement and test operations, and known projections of binning designation based on the received measurement and testing data from fabrication of the multitude of semiconductor devices.

21. A computer program product for sorting a fabricated semiconductor device into a higher performance designated sorting bin by improving a performance level of the semiconductor device, the computer program product comprising:

one or more computer readable storage media wherein the computer readable storage medium is not a transitory signal per se, and program instructions stored on the one or more computer readable storage media, the program instructions comprising:

program instructions to determine a predicted sorting bin of a semiconductor device, based on measurement and test data performed on the semiconductor device subsequent to a current metallization layer;

program instructions to determine a target sorting bin for the semiconductor device, wherein the target sorting bin is a higher performance designated bin than the predicted sorting bin, and wherein the target sorting bin is determined by a machine learning model that determines a performance level improvement of the semiconductor device attainable by adjustments made to process parameters of one or more subsequent metallization layers of the semiconductor device;

program instructions to generate adjustments for the process parameters of the one or more subsequent metallization layers of the semiconductor device, based on measurement and test data of the current metallization layer of semiconductor device; and program instructions to adjust the process parameters of the one or more subsequent metallization layer processes of the semiconductor device.

22. The computer program product of claim 21, wherein the adjustments for process parameters of the one or more subsequent metallization layers include adding additional metallization layers to an original design of metallization layers for the semiconductor device.

23. The computer program product of claim 21, wherein the adjustments to the process parameters include adjustments to a design of the semiconductor device.

24. A computer system for sorting a fabricated semiconductor device into a higher performance designated sorting bin by improving a performance level of the semiconductor device, the computer program product comprising:

one or more computer processors, one or more computer readable storage media, program instructions stored on the computer readable storage media for execution by at least one of the one or more processors, the program instructions comprising:

program instructions to determine a predicted sorting bin of a semiconductor device, based on measurement and test data performed on the semiconductor device subsequent to a current metallization layer;

program instructions to determine a target sorting bin for the semiconductor device, wherein the target sorting bin is a higher performance designated bin than the predicted sorting bin, and wherein the target sorting bin is determined by a machine learning model that determines a performance level improvement of the semiconductor device attainable by adjustments made to process parameters of one or more subsequent metallization layers of the semiconductor device;

program instructions to generate adjustments for the process parameters of the one or more subsequent metallization layers of the semiconductor device, based on measurement and test data of the current metallization layer of semiconductor device; and program instructions to adjust the process parameters of the one or more subsequent metallization layer processes of the semiconductor device.

25. The computer system of claim 24, wherein program instructions continuously re-train the machine learning model by program instructions to transmit to the machine learning model, process parameter adjustments and corresponding performance level testing data of a current metallization layer of the semiconductor device.

* * * * *